(12) United States Patent
Abe

(10) Patent No.: US 6,239,413 B1
(45) Date of Patent: May 29, 2001

(54) LIGHT IRRADIATION ANNEALING APPARATUS HAVING INFRARED RADIATION CUT FILTER

(75) Inventor: Kenichiro Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/439,986

(22) Filed: Nov. 12, 1999

(30) Foreign Application Priority Data

Nov. 13, 1998 (JP) .................................................. 10-324076

(51) Int. Cl.⁷ ........................................................ A21B 1/00
(52) U.S. Cl. .......................... 219/411; 219/390; 392/416; 118/724
(58) Field of Search ..................................... 219/390, 405, 219/411; 392/416, 418; 118/724, 725, 501

(56) References Cited

U.S. PATENT DOCUMENTS

| | | | |
|---|---|---|---|
| 4,806,321 | * 2/1989 | Nishizawa et al. | 422/245 |
| 5,156,820 | * 10/1992 | Wong et al. | 422/186.05 |
| 5,534,069 | * 7/1996 | Kuwabara et al. | 118/719 |

FOREIGN PATENT DOCUMENTS

| | | |
|---|---|---|
| 58-97837 | 6/1983 | (JP) . |
| 61-75517 | 4/1986 | (JP) . |
| 62-82730 | 5/1987 | (JP) . |
| 2-275622 | 11/1990 | (JP) . |
| 3-266424 | 11/1991 | (JP) . |

* cited by examiner

*Primary Examiner*—Teresa Walberg
*Assistant Examiner*—Shawntina Fuqua

(57) ABSTRACT

In a light radiation annealing apparatus for annealing a semiconductor wafer, an infrared radiation cut filter is inserted between a lamp heater and the semiconductor wafer to cut an infrared component of light emitted from the light source. Thus, the semiconductor wafer is annealed by the light irradiation apparatus to an approximate temperature irrespective of the resistivity of the semiconductor substrate.

6 Claims, 7 Drawing Sheets

LIGHT IRRADIATION ANNEALING APPARATUS HAVING INFRARED RADIATION CUT FILTER

BACKGROUND OF THE INVENTION

1. Field of the Invention

The present invention relates to a light irradiation annealing apparatus called a Ramp annealing apparatus or a rapid thermal annealing (RTA) apparatus for annealing semiconductor wafers.

2. Description of the Related Art

Generally, in a prior art Ramp annealing apparatus, an annealing chamber is in a vacuum state, so that semiconductor wafers are heated only by radiation of a lamp heater. This will be explained later in detail.

In the above-described prior art Ramp annealing apparatus, however, since the temperature of the semiconductor wafer depends upon the resistivity, if the temperature of the semiconductor wafer is controlled by the power of the lamp heater, the power condition of the apparatus has to be adjusted to conform with the resistivity of the semiconductor wafer, which would increase the manufacturing cost.

Note that, if the temperature of the semiconductor wafer is monitored by a pyrometer or a thermocouple, the power of the lamp heater can be controlled based on the monitored temperature.

SUMMARY OF THE INVENTION

It is an object of the present invention to provide an light irradiation (Ramp) annealing apparatus which does not need to set conditions for different resistivities of semiconductor wafers.

According to the present invention, in a light radiation annealing apparatus for annealing a semiconductor wafer, an infrared radiation cut filter is inserted between a lamp heater and the semiconductor wafer to cut an infrared component of light emitted from the lamp heater. Thus, the semiconductor wafer is annealed by the light irradiation apparatus to an approximate temperature irrespective of the resistivity of the semiconductor wafer.

BRIEF DESCRIPTION OF THE DRAWINGS

The present invention will be more clearly understood from the description set forth below, as compared with the prior art with reference to the accompanying drawings, wherein.

DESCRIPTION OF THE PREFERRED EMBODIMENT

Before the description of the preferred embodiment, a prior art Ramp annealing apparatus will be explained with reference to FIG. 1.

Figure 1:
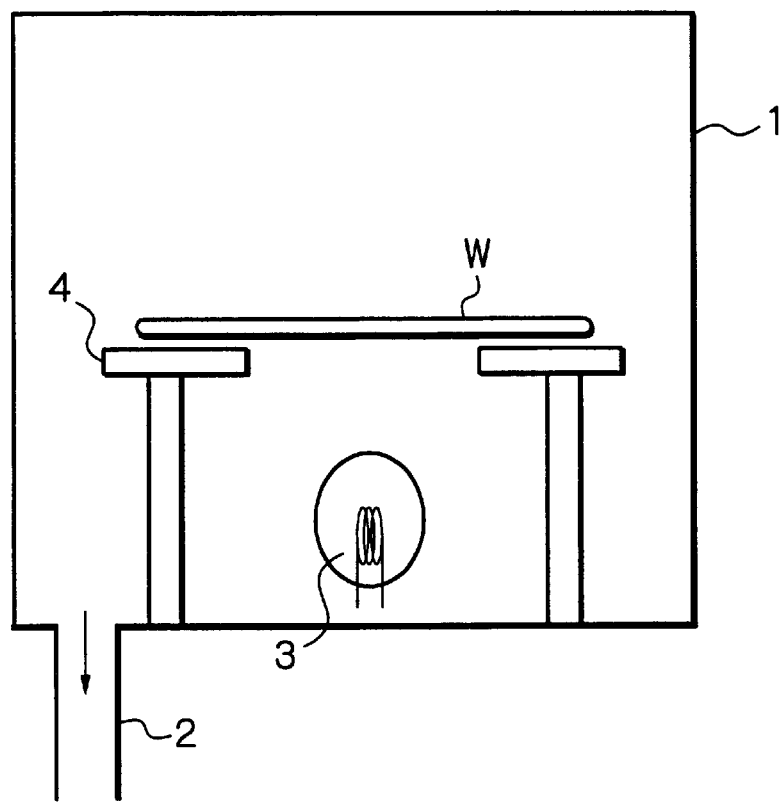
FIG. 1 is a diagram view illustrating a prior art Ramp annealing apparatus.

In FIG. 1, which illustrates a Ramp annealing apparatus used as a preheating chamber in a sputtering apparatus, a chamber 1 is in a vacuum state via an exhaust pipe 2 connected to a vacuum motor (not shown). A lamp heater 3 and a wafer holder 4 are provided within the chamber 1.

A semiconductor wafer W is mounted on the wafer holder 4. As a result, the semiconductor wafer W is irradiated with light emitted from the lamp heater 3.

Figure 2:
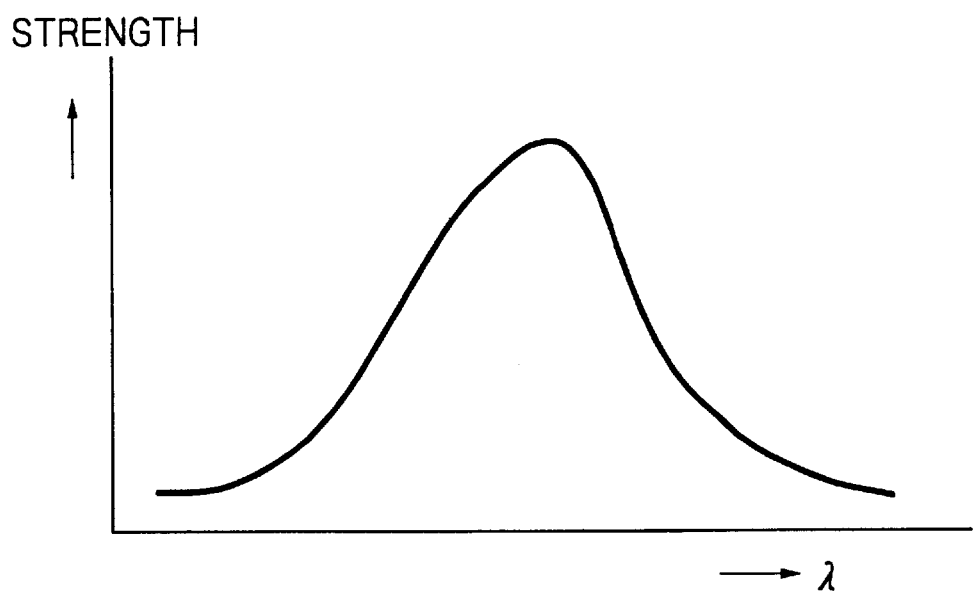
FIG. 2 is a graph showing the strength spectrum of light irradiated onto the semiconductor wafer of FIG. 2.

The light emitted from the lamp heater 3 having a strength spectrum as shown in FIG. 2 heats the semiconductor wafer W.

Figure 3:
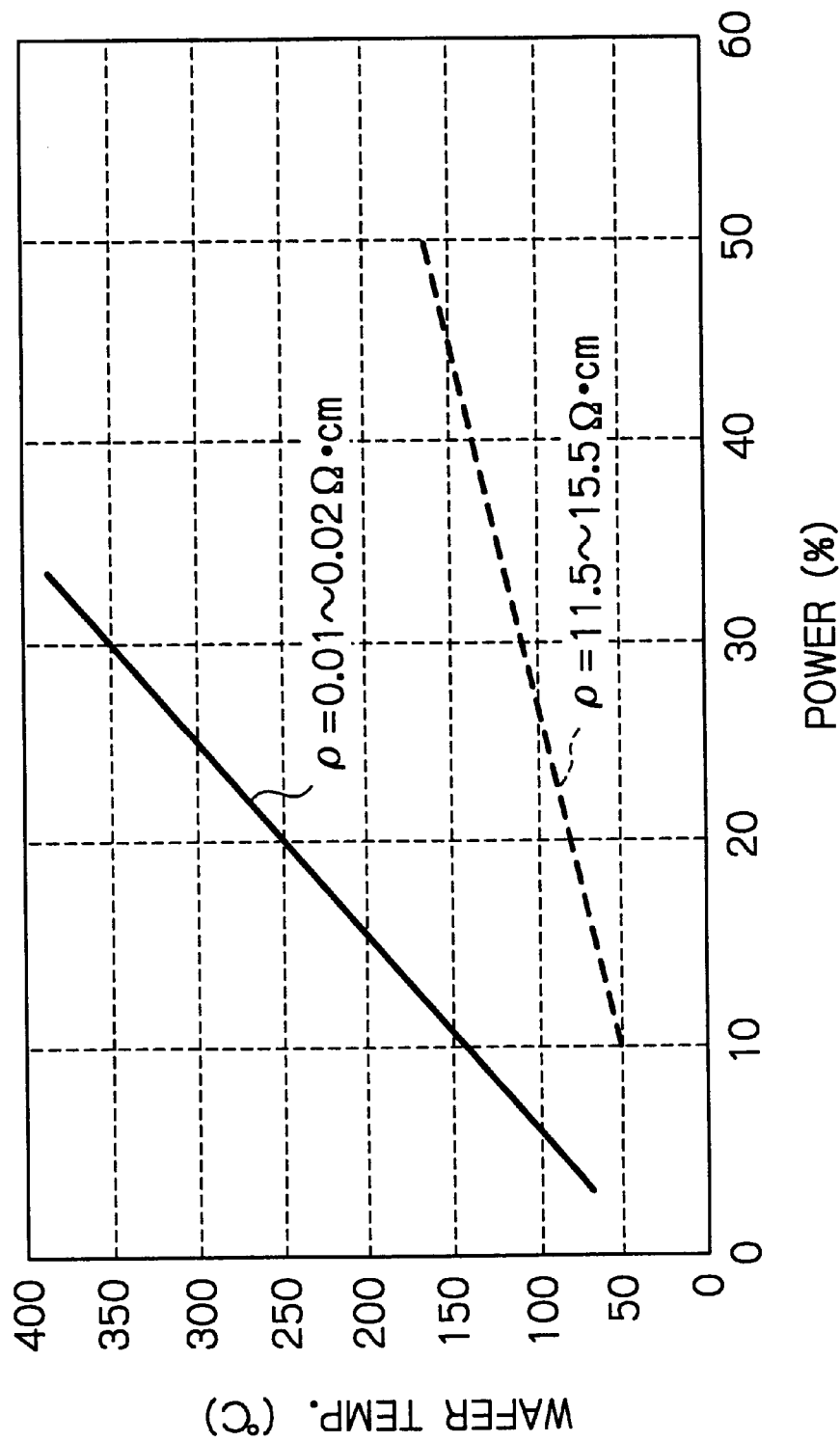
FIG. 3 is a graph showing the relationship between the temperature of the semiconductor wafer and the resistivity of the semiconductor wafer of FIG. 1.

In the Ramp annealing apparatus of FIG. 1, however, since all of the entire light emitted from the lamp heater 3 conttributes to the heating of the semiconductor wafer W, the temperature of the semiconductor wafer W greatly depends upon the resistivity thereof. That is, as shown in FIG. 3, the lower the resistivity of the semiconductor wafer W, the higher the temperature of the semiconductor wafer W. Thus, the power condition of the Ramp annealing apparatus of FIG. 1 has to be adjusted to conform with the resistivity of the semiconductor wafer W, which would increase the manufacturing cost.

The principle of the present invention is explained next with reference to FIGS. 4, 5A, 5B, 5C, 6A, 6B, 7A and 7B.

Figure 4:
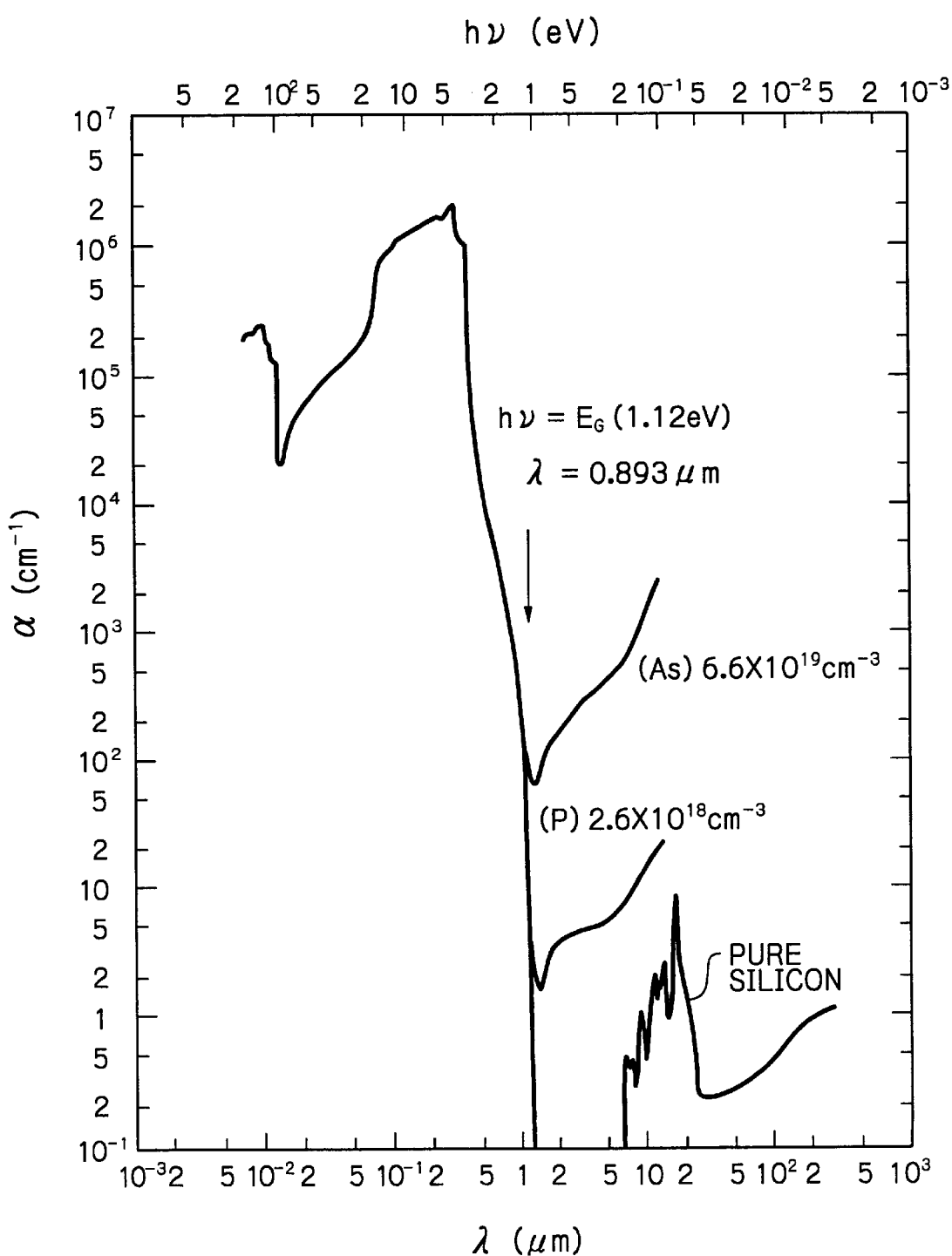
FIGS. 4, 5A, 5B and 5C are graphs showing the relationship between the wavelength (energy) and absorption coefficient of silicon crystal.

As shown in FIG. 4, which shows the relationship between the wavelength $\lambda$ (energy hv) and absorption coefficient $\alpha$ of silicon crystal, when $\lambda \leq 893$ nm or $hv \geq 1.12$ eV where the energy gap $E_G$ of silicon crystal is 1.12 eV, the absorption coefficient $\alpha$ is the same for pure silicon, silicon having a phosphorus concentration of $2.6 \times 10^{18}$ cm$^{-3}$ and silicon having an arsenic concentration of $6.6 \times 10^{19}$ cm$^{31\ 3}$. On the other hand, when $\lambda 893$ nm or $hv<1.12$ eV, the absorption coefficient $\alpha$ differs depending upon the impurity concentration of silicon crystal.

Figure 5A:
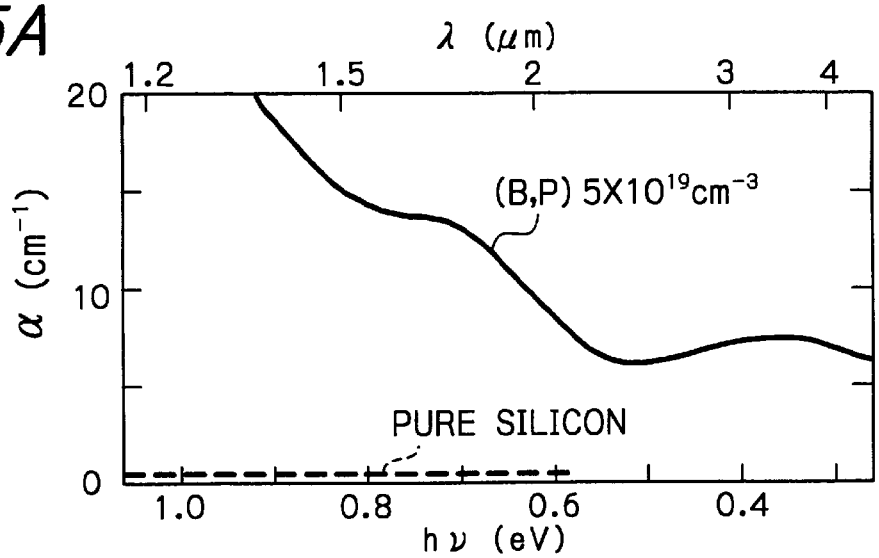
Figure 5B:
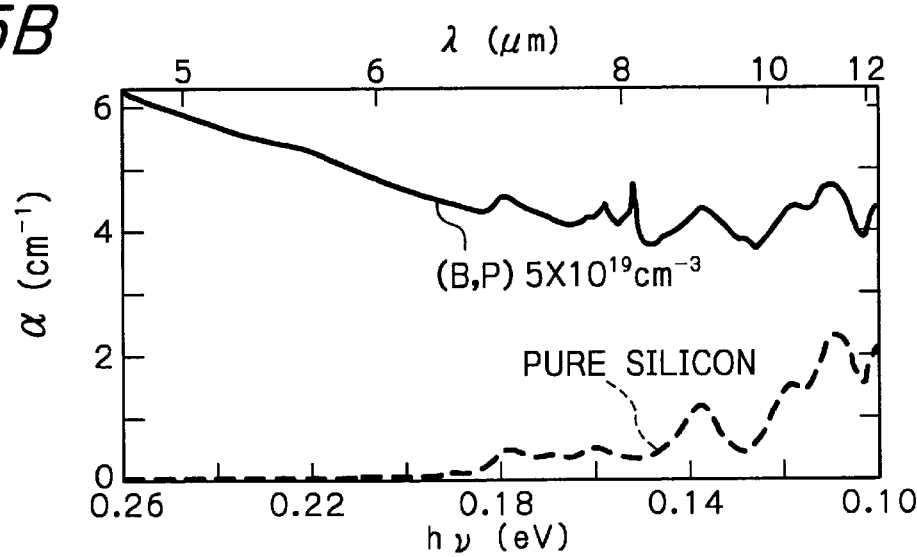
Figure 5C:
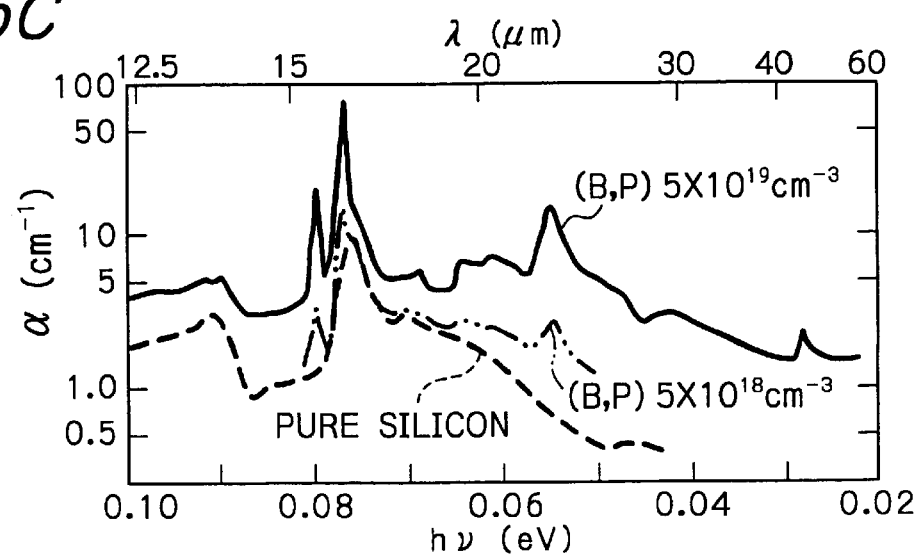

Similarly, as shown in FIGS. 5A, 5B and 5C, which also shows the relationship between the wavelength $\lambda$ (energy hv) and absorption coefficient $\alpha$ of silicon crystal, when $\lambda>893$ nm or $hv<1.12$ eV, the absorption coefficient $\alpha$ differs depending upon the impurity concentration of silicon crystal.

Generally, the higher the impurity concentration of silicon crystal, the lower the resistivity of silicon crystal. Therefore, when $\lambda>893$ nm or $hv<1.12$ eV, the absorption coefficient $\alpha$ differs depending upon the resistivity of silicon crystal.

The dependency of the absorption coefficient $\alpha$ upon the resistivity of silicon crystal is explained next with reference to FIGS. 6A, 6B, 7A and 7B.

Figure 6A:
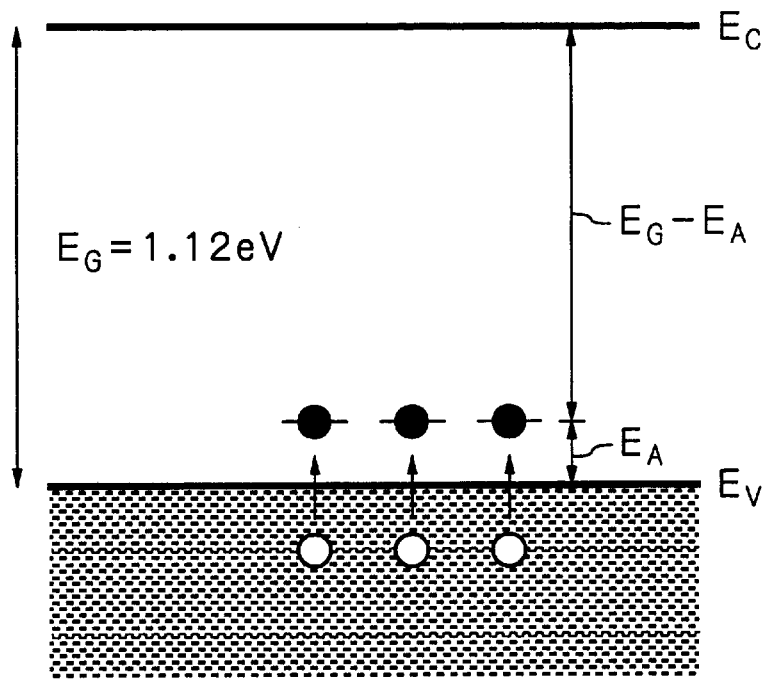
FIGS. 6A and 6B are energy band diagrams of silicon crystal of a P-type.
Figure 6B:
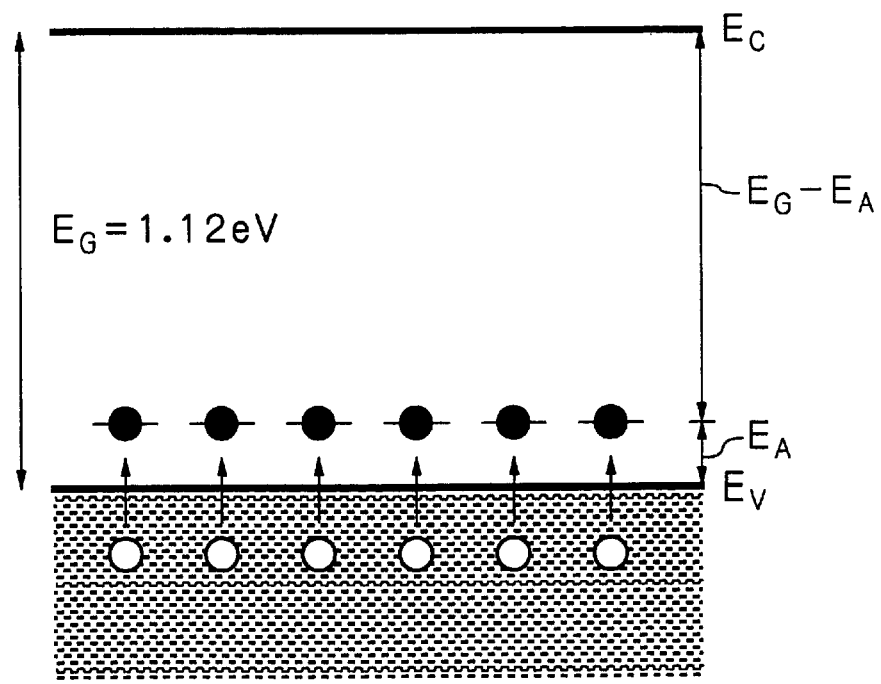

If silicon crystal is of a P-type including column III impurities called acceptor impurities such as boron, the energy band of this silicon crystal can be as shown in FIGS. 6A and 6B. Note that FIG. 6A shows silicon crystal having a low acceptor impurity concentration, while FIG. 6B shows silicon crystal having a high acceptor impurity concentration. Further, in FIGS. 6A and 6B, $E_C$ is a conduction band energy, $E_V$ is a valence band energy, $E_G$ is an energy gap of silicon crystal (=1.12 eV) and $E_A$ is an acceptor ionization energy or an acceptor level ($\approx 0.05$ eV).

As shown in FIGS. 6A and 6B, if light having a frequency smaller than a wavelength corresponding to the energy gap $E_G$ is incident to silicon crystal, electrons may be excited from the valence band to the conduction band. Thus, such light is absorbed in the silicon crystal. Also, if light having a wavelength corresponding to the acceptor ionization energy $E_A$ is incident to the silicon crystal, electrons may be excited from the valence band to the acceptor level $E_A$. Thus, such light is also absorbed in the silicon crystal. Further, if light having a wavelength corresponding to $E_G$–$E_A$ is incident to the silicon crystal, electrons may be excited from the acceptor level $E_A$ to the conduction band. Thus, such light is further absorbed in the silicon crystal. Therefore, since the silicon crystal having the energy band characteristics of FIG. 6A has a smaller acceptor impurity concentration than the silicon crystal having the energy band characteristics of FIG. 6B, the absorption coefficient α of the former silicon crystal is smaller than that of the latter silicon crystal, where the energy of light is smaller than the energy gap $E_G$.

Figure 7A:
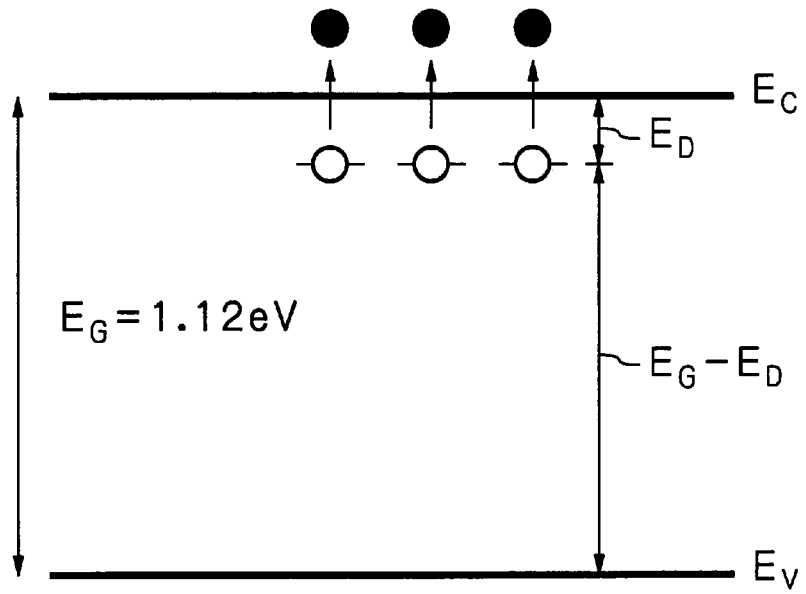
FIGS. 7A and 7B are energy band diagrams of silicon crystal of an N-type.
Figure 7B:
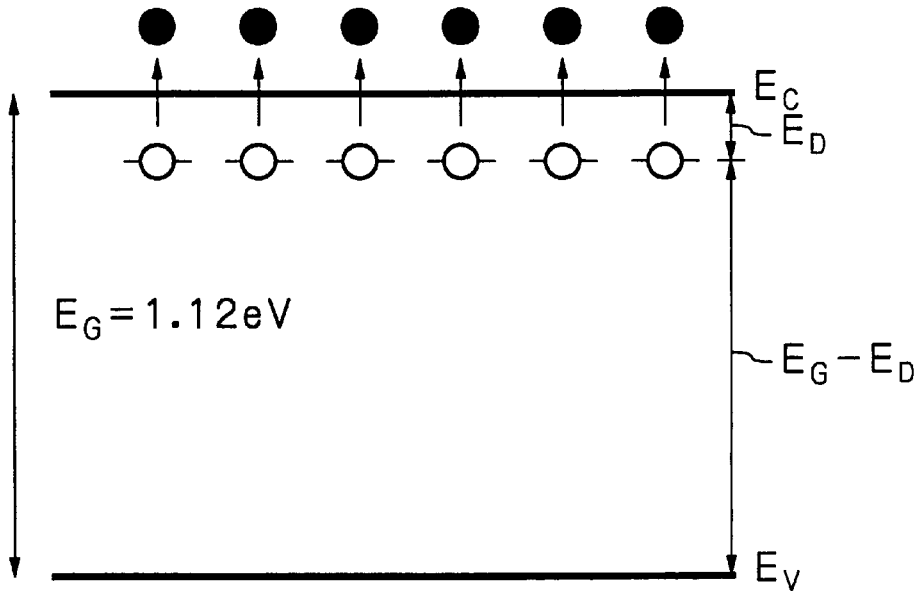

If silicon crystal is of an N-type including column V impurities called donor impurities such as phosphorus or arsenic, the energy band of this silicon crystal can be as shown in FIGS. 7A and 7B. Note that FIG. 7A shows silicon crystal having a low donor impurity concentration, while FIG. 6B shows silicon crystal having a high donor impurity concentration. Further, in FIGS. 7A and 7B, $E_D$ is a donor ionization energy or a donor level (≈0.05 eV).

As shown in FIGS. 7A and 7B, if light having a wavelength smaller than a wavelength corresponding to the energy gap $E_G$ is incident to silicon crystal, electrons may be excited from the valence band to the conduction band. Thus, such light is absorbed in the silicon crystal. Also, if light having a wavelength corresponding to the donor ionization energy $E_D$ is incident to the silicon crystal, electroms may be excited from the donor level $E_D$ to the conduction band. Thus, such light is also absorbed in the silicon crystal. Further, if light having a wavelength corresponding to $E_G$–$E_D$ is incident to the silicon crystal, electrons may be excited from the valence band to the donor level $E_D$. Thus, such light is further absorbed in the silicon crystal. Therefore, since the silicon crystal having the energy band characteristics of FIG. 7A has a smaller donor impurity concentration than the silicon crystal having the energy band characteristics of FIG. 7B, the absorption coefficient α of the former silicon crystal is smaller than that of the latter silicon crystal, where the energy of light is smaller than the energy gap $E_G$.

Figure 8:
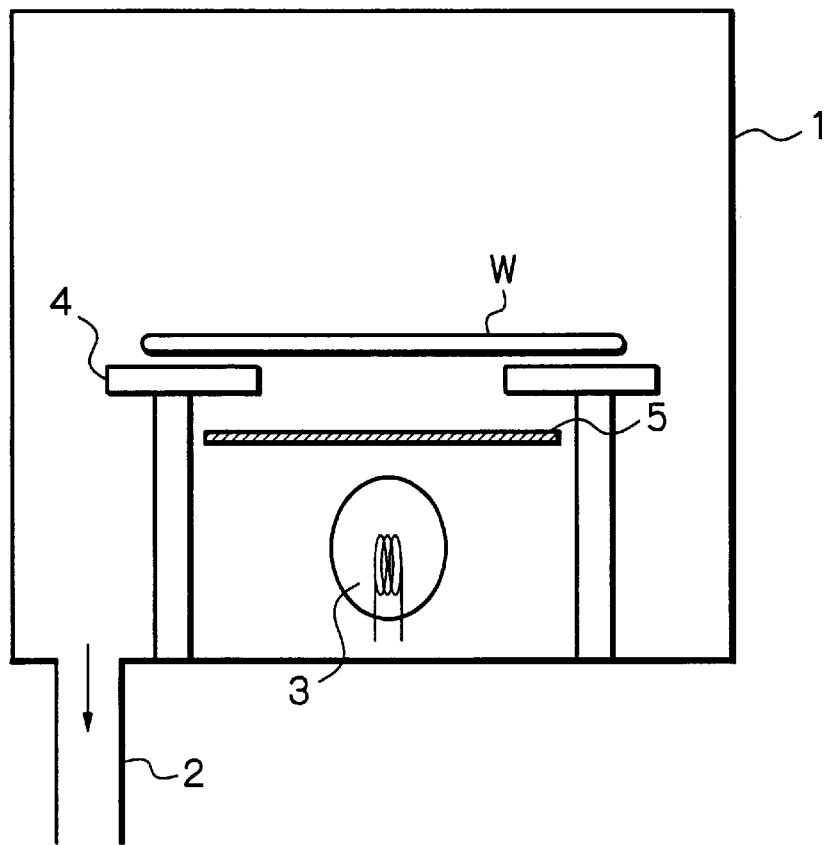
FIG. 8 is a diagram illustrating an embodiment of the Ramp annealing apparatus according to the present invention.
Figure 9:
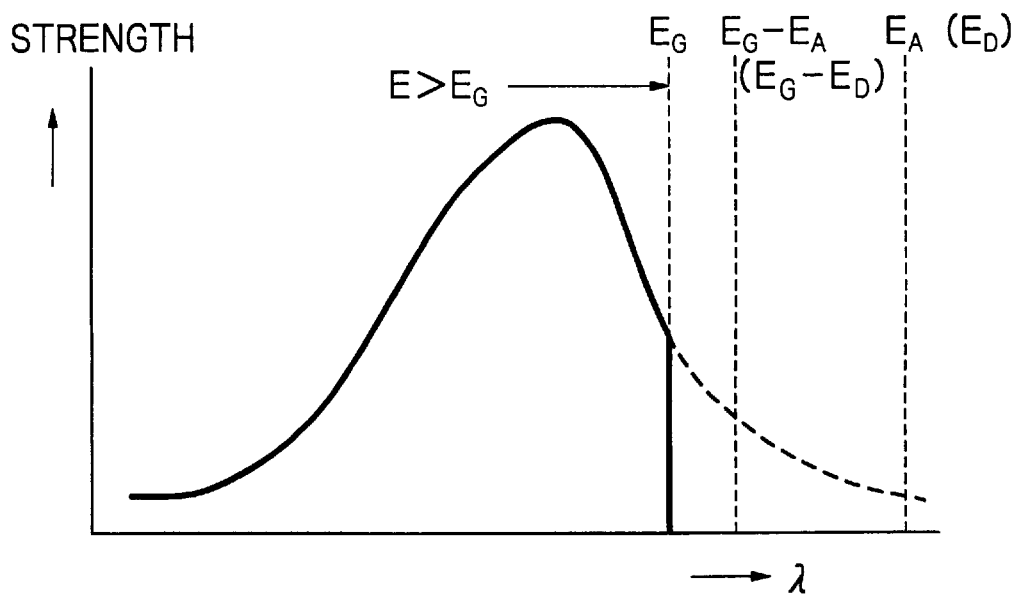
FIG. 9 is a graph showing the strength spectrum of light irradiated onto the semiconductor wafer of FIG. 8.

In FIG. 8, which illustrates an embodiment of the present invention, an infrared radiation cut filter 5 is inserted between the lamp heater 3 and the semiconductor wafer W to remove an infrared component of the light emitted from the lamp heater 3. That is, the infrared radiation cut wavelength of the infrared radiation cut filter 5 is approximately 893 nm corresponding to the energy gap $E_G$ (=1.12 eV) of silicon crystal. For example, the infrared radiation cut wavelength is 890 nm a little smaller than 89 nm. As a result, the light through the infrared radiation cut filter 5 irradiated onto the semiconductor wafer W has a strength spectrum as shown in FIG. 9.

Thus, since the light irradiated onto the semiconductor wafer W does not include components having a smaller energy that the energy band gap $E_G$, this light is entirely absorped in the semiconductor wafer W irrespective of the resistivity thereof. Particularly, there is no light component in the light irradiated onto the semiconductor wafer W for exciting electrons from the valence band to the acceptor level $E_A$ or from the donor level $E_D$ to the conduction band. Also, there is no light component in the light irradiated onto the semiconductor wafer W for exciting electrons from the acceptor level $E_A$ to the conduction band or from the valence band to the donor level $E_D$.

In the above-described embodiment, the infrared radiation cut filter 5 removes all light components having an energy smaller than the energy band $E_G$; however, if the infrared radiation cut filter 5 removes only wavelengths corresponding to the difference $E_G$–$E_A$ ($E_G$–$E_D$) in energy between the energy gap $E_G$ and the acceptor level $E_A$ (or the donor level $E_D$) and corresponding to the acceptor ionization energy $E_A$ (or the donor ionization energy $E_D$), the light through the infrared radiation cut filter 5 can entirely be absorbed in the semiconductor wafer W irrespective of the resistivity thereof.

The present invention can also be applied to other semiconductor wafers made of gallium arsenic (GaAs), indium phosphide (InP) or the like. Note that the energy gap of GaAs crystal is 1.43 eV, and the energy gap of InP crystal is 1.34 eV.

As explained hereinabove, according to the present invention, since the light through the infrared radiation cut filter is entirely absorbed in a semiconductor wafer irrespective of the resistivity thereof, it is unnecessary to set conditions in the Ramp annealing apparatus for different resistivities of semiconductor wafers, which would reduce the manufacturing cost.

What is claimed is:

1. A light radiation annealing apparatus for annealing a semiconductor wafer, comprising:

a lamp heater; and an infrared radiation cut filter, inserted between said lamp heater and said semiconductor wafer, for cutting an infrared component of light emitted from said light source, wherein said infrared radiation cut filter removes a wavelength component of said light larger than a wavelength of an energy gap of said semiconductor wafer.

2. The apparatus as set forth in claim 1, wherein said semiconductor wafer is made of silicon crystal.

3. The apparatus as set forth in claim 1, wherein said semiconductor wafer is made of gallium arsenic crystal.

4. The apparatus as set forth in claim 1, wherein said semiconductor wafer is made of indium phosphide crystal.

5. A light radiation annealing of a P-type apparatus for annealing a semiconductor wafer, comprising:

a lamp heater; and a radiation cut filter, inserted between said lamp heater and said semiconductor wafer, for removing a first wavelength component corresponding to a difference between an energy gap and an acceptor ionization energy of said semiconductor substrate and a second wavelength component corresponding to said acceptor ionization energy from light passing through said radiation cut filter.

6. A light radiation annealing of an N-type apparatus for annealing a semiconductor wafer, comprising:

a lamp heater; and a radiation cut filter, inserted between said lamp heater and said semiconductor wafer, for removing a first wavelength component corresponding to a difference between an energy gap and a donor ionization energy of said semiconductor substrate and a second wavelength component corresponding to said donor ionization energy from light passing through said radiation cut filter.

* * * * *